(12) United States Patent
Grout

(10) Patent No.: US 10,802,447 B1
(45) Date of Patent: Oct. 13, 2020

(54) LINEARIZED TIME AMPLIFIER ARCHITECTURE FOR SUB-PICOSECOND RESOLUTION

(71) Applicant: BAE Systems Information and Electronic Systems Integration Inc., Nashua, NH (US)

(72) Inventor: Kevin Grout, Chandler, AZ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/415,162

(22) Filed: May 17, 2019

(51) Int. Cl.
| | |
|---|---|
| H03M 1/12 | (2006.01) |
| G04F 10/00 | (2006.01) |
| H03K 5/151 | (2006.01) |
| H03L 7/081 | (2006.01) |
| H03L 7/16 | (2006.01) |
| H03L 7/099 | (2006.01) |

(52) U.S. Cl.
CPC ......... *G04F 10/005* (2013.01); *H03K 5/1515* (2013.01); *H03L 7/081* (2013.01); *H03L 7/0996* (2013.01); *H03L 7/16* (2013.01); *H03M 1/12* (2013.01)

(58) Field of Classification Search
CPC ........ H03M 1/12; G04F 10/005; H03L 7/081; H03L 7/0996
USPC .................................................. 341/155, 157
See application file for complete search history.

(56) References Cited

U.S. PATENT DOCUMENTS

| | | | |
|---|---|---|---|
| 5,889,436 A | 3/1999 | Yeung et al. | |
| 8,669,810 B2 | 3/2014 | Kwon et al. | |
| 2005/0007168 A1* | 1/2005 | Park | H03K 5/1565 327/175 |
| 2011/0204949 A1* | 8/2011 | Ho | G06F 1/06 327/199 |
| 2017/0370971 A1* | 12/2017 | Liu | H02M 7/5387 |
| 2019/0081619 A1* | 3/2019 | Kim | H03K 5/1565 |

OTHER PUBLICATIONS

Hye-Jung Kwon, Jae-Seung Lee, Byungsub Kim, Jae-Yoon Sim, and Hong-June Park, Analysis of an Open-Loop Time Amplifier with a Time Gain Determined by the Ratio of Bias Current, IEEE Transactions on Circuits and Systems—II: Express Briefs, Jul. 2014, pp. 481-485, vol. 61, No. 7.

Y. Cao, et al., Chapter 2: Background on Time-to-Digital Converters, Radiation-Tolerant Delta-Sigma Time-to-Digital Converters, Analog Circuits and Signal Processing, 2015, pp. 15-23, Springer International Publishing, Switzerland.

Jiyu Chen, Song Jia, Yuan Wang, A 10b, 0.7ps Resolution Coarse-Fine Time-to-Digital Converter in 65nm CMOS Using a Time Residue Amplifier, IEEE, 2015.

* cited by examiner

*Primary Examiner* — Peguy Jean Pierre
(74) *Attorney, Agent, or Firm* — Sand, Sebolt & Wernow LPA; Scott J. Asmus

(57) ABSTRACT

The present disclosure relates to a circuit and method of operation thereof for linearized time amplifier architecture for sub-picosecond resolution. More particularly, the disclosure is directed to an asymmetric edge manipulator whose output is fed to four series of transistors and is operatively coupled to a reset. The disclosure relates to outputting a pair of signals that correspond to a first input and second input of a known and measured clock that may be adjustable with gain to be perceptible to an external device that can then correct for the gain to allow measurement of sub-picosecond resolution.

19 Claims, 5 Drawing Sheets

LINEARIZED TIME AMPLIFIER ARCHITECTURE FOR SUB-PICOSECOND RESOLUTION

TECHNICAL FIELD

The present disclosure relates generally to a linearized time amplifier for sub-picosecond resolution. More particularly, the present disclosure relates to an asymmetrical manipulator fed by two clock signals with two outputs. Specifically, the present disclosure relates to a circuit design with an asymmetrical manipulator, a tri-state reset generator, and transistor sets triggering a pseudo-pmos inverter.

BACKGROUND

Time-to-digital converters (TDCs) are key building blocks in time-based mixed-signal systems, used for the digitization of analog signals in time domain. A TDC or Time Digitizer is a device for recognizing events and providing a digital representation of the time at which they occurred. Usually a TDC output is the time of arrival for each incoming pulse which is represented through timestamps, namely a file containing the time occurrence of each event with a defined resolution, which may be stored in a storage medium such as flash memory, a disk drive or PC. The TDC is an asynchronous apparatus, or in other words, the time precision of such a device can be much higher than the internal clock of the computer or other such device to which the TDC is connected. TDCs are used in many different applications, where the time interval between two signal pulses (start and stop pulse) of an event should be determined. One of the classical TDC architectures is based on the coarse-fine architecture where the measurement is started and stopped, when either the rising or the falling edge of a signal pulse crosses a set threshold.

Analog phrase frequency detectors (PFD) have a series of problems associated with them and digital versions are much more precise and allow for greater resolution. As a result, high resolution time-to-digital converters (TDCs) have gained more and more interest due to their increasing implementation in digital phase-locked loops (PLLs), analog-to-digital converters (ADCs), jitter measurement, and time-of-flight (TOF) range finders. In its simplest implementation, a TDC can be simply a high frequency counter that increments every clock cycle. However, the time resolution of this type of TDC is practically limited by the highest available clock frequency.

In recent years, TDCs are widely used in digital signal processing, especially the use as a PFD in all-digital phase-locked loops (ADPLL) when it is required to have high-resolution, high-speed and low power consumption.

Conventional TDC structures utilize delay chain to achieve high resolution, and the minimum resolution time is decided by the delay of one logic gate. However, the time resolution of conventional TDC is closely related to the process technology, since the time resolution is proportional to an inverter delay.

It has been determined that one may obtain higher resolution, through use of a Vernier TDC. The Vernier TDC utilizes two delay chains with different delay to achieve sub-gate resolution, and in theory the time interval can be infinitely small. As such, the Vernier TDC may achieve a fine tine resolution below an inverter delay. However, mismatch of the delay lines limits the resolution and the area increases linearly with the resolution when measuring the same time interval. Nevertheless, the Vernier TDC usually requires an excessively long chain of inverters, thus causing too much power consumption.

Prior art has believed that in order for a time difference amplifier to be effectively used in various application fields, some conditions should be satisfied. Typical conditions include gain, a wide input range and linearity.

Since a time difference amplifier is used by being coupled mainly with a time-to-digital converter, a number of time difference amplifiers should be connected in series when a time gain is small, to obtain a desired time gain and a desired time resolution. Additionally, in the case where a time difference amplifier operates only in a period with a narrow time difference between the changing edges of input signals, the operating range of the time-to-digital converter is limited. Still another reason resides in that, in the case where a time gain of a time difference amplifier is not constant with respect to the time difference between the changing edges of the input signals, the time difference amplifier cannot be used in an application where a precise time period is to be measured.

High quality digital Phase Locked Loops (PLL) must convert extremely small time differences to digital outputs. Additionally, in order to effectively measure small differences, the difference must first be multiplied (amplified). In pipelined architectures, multiple amplifications occur. Existing time amplifiers only work for large (tens or hundreds of ps) time differences. Prior art solutions may be hard to tune, have poor resolution, is process, voltage or temperature intolerant, or may suffer from pulse swallowing distortion.

SUMMARY

As such, TDC's may benefit from improvement, and may be improved by introducing an amplifier that can work for time differences on the order of 100 fs or smaller.

In one aspect, an exemplary embodiment of the present disclosure may provide a signal processing device comprising: a known clock generator providing a first clock signal, said first clock signal having an accurate predetermined period, a system clock providing a second clock signal, said second clock signal has a measured period, an asymmetric manipulator, wherein the first clock signal and second clock signal are subjected to the asymmetric manipulator upon initial input into a circuit and output a first input and a second input, and at least one triggering device operative to output at least one signal pulse based on travel time of the first input and second input through the circuit. This exemplary embodiment or another exemplary embodiment may further provide for the triggering device to be a pseudo-pmos inverter. This exemplary embodiment or another exemplary embodiment may further provide for device to be free of any explicit capacitor. This exemplary embodiment or another exemplary embodiment may further provide for the asymmetric manipulator to include a current limiting device. This exemplary embodiment or another exemplary embodiment may further provide for a receiving device, operative to receive the at least one signal pulse and interpret the at least one signal pulse. This exemplary embodiment or another exemplary embodiment may further provide for the receiving device to be operative to determine the time difference between the at least one signal pulse and divide by a known gain of the circuit in order to recognize sub-picosecond time differences. This exemplary embodiment or another exemplary embodiment may further provide for the triggering device to be a comparator. This exemplary embodiment or another exemplary embodiment may further provide for a tristate inverter for generating the reset pulse comprising: a reset circuit including: a first inverted input and a second inverted input, wherein the first inverted input and second inverted input occur as a result of subjecting a first inverted clock signal and a second inverted clock signal to the asymmetrical manipulator and the first inverted input and second inverted input are both 180 degrees out of phase when compared to the first input and second input respectively, and a series of four transistors, that feed a further transistor, wherein when both first and second inverted inputs are 0, the further transistor will go into conduction, and when both of the first and second inverted inputs are 1, the further transistor will go to low, and when the first and second inverted inputs are different, the further transistor will cause the reset circuit to disconnect. This exemplary embodiment or another exemplary embodiment may further provide for a first voltage applied to the asymmetric manipulator and a second voltage applied to a portion of the circuit, wherein the second voltage is adjustable to provide adjustable gain within the circuit as a whole. This exemplary embodiment or another exemplary embodiment may further provide for a third voltage differing from the first voltage and second voltage and is applied to a portion of the circuit, differing from the portion of the second voltage, wherein both the second voltage and the third voltage are adjustable independently to provide gain to the portion of the circuit to which they are applied.

In another aspect, an exemplary embodiment of the present disclosure may provide for a method for measuring digital signals including: inserting a first signal from a first clock into a first branch of an asymmetric manipulator, outputting a first input signal from the asymmetric manipulator; inserting a second signal from a second clock into a second branch of an asymmetric manipulator, outputting a second input signal from the asymmetric manipulator, transmitting the first signal and second signal to four sets of transistors, and interchangeably: triggering a first output signal when the first and second set of transistors are engaged, said output relating to the second signal travel time through the circuit; or triggering a second output signal and the third and fourth set of transistors engaged relating to the first signal travel time through the circuit. This exemplary embodiment or another exemplary embodiment may further provide for routing the first signal from the first clock into a current limiting device prior to outputting the first input signal; and routing the second signal from the second clock into a current limiting device prior outputting the second input signal. This exemplary embodiment or another exemplary embodiment may further provide for after transmitting the signals: passing the first input signal through a second transistor in the first set, passing the second input signal through a first transistor in the first set, passing the first input signal through a first transistor in the second set, passing the second input signal through a second transistor in the second set, passing the first input signal through a first transistor in the third set, passing the second input signal through a second transistor in the third set, passing the first input signal through a second transistor in the fourth set, and passing the second input signal through a first transistor in the fourth set. This exemplary embodiment or another exemplary embodiment may further provide for analyzing the first output signal and second output signal to determine if the first and second clock are properly in time by measuring a time offset. This exemplary embodiment or another exemplary embodiment may further provide for prior to inserting the first signal and inserting the second signal: introducing a source voltage to the asymmetric manipulator. This exemplary embodiment or another exemplary embodiment may further provide for feeding a biased voltage to the four sets of transistors. This exemplary embodiment or another exemplary embodiment may further provide for adjusting gain of the circuit based on the biased voltage fed to the four sets of transistors. This exemplary embodiment or another exemplary embodiment may further provide for accounting for the gain and analyzing the first output signal and second output signal to determine if the first and second clock are properly in time by measuring a time offset. This exemplary embodiment or another exemplary embodiment may further provide for generating a reset pulse with a tristate inverter, wherein the tri state inverter comprises: a reset circuit including: a first inverted input and a second inverted input, wherein the first inverted input and second inverted input occur as a result of subjecting a first inverted clock signal and a second inverted clock signal to the asymmetrical manipulator and the first inverted input and second inverted input are both 180 degrees out of phase when compared to the first input and second input respectively, a series of four transistors, that feed a further transistor, wherein when both first and second inverted inputs are 0, the further transistor will go into conduction, and when both of the first and second inverted inputs are 1, the further transistor will go to low, and when the first and second inverted inputs are different, the further transistor will cause the reset circuit to disconnect.

In yet another aspect, an exemplary embodiment of the present disclosure may provide a circuit comprising: a known clock generator providing a first clock signal, said first clock signal having an accurate predetermined period, a system clock providing a second clock signal, said second clock signal has a measured period, an asymmetric manipulator, wherein the first clock signal and second clock signal are subjected to the asymmetric manipulator upon initial input into a circuit and output a first input and a second input and a first inverted input and a second inverted input that are 180 degrees out of phase with their counterparts, four transistor sets, wherein the first input passes through a second transistor in the first set, and the second input through a first transistor in the first set, the first input passes through a first transistor in the second set and the second signal passes through a second transistor in the second set, the first input passes through a first transistor in the third set and the second input passes through a second transistor in the third set, the first input passes through a second transistor in the fourth set and the second input passes through a first transistor in the fourth set; and wherein each set of transistors is attached to a transistor with a programmable vbias transistor operative to set an identical gain value for each set of transistors, a first pseudo-pmos transistor in electrical engagement with the first set and second set of transistors and a second pseudo-pmos transistor in electrical engagement with the third set and fourth set of transistors, wherein when the first set and second set of transistors are drained, the first pseudo-pmos transistor will output a first signal pulse to a detector and the when the third and fourth set of transistors are drained, the second pseudo-pmos transistor will output a second signal pulse to the detector.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

A new circuit 10 and method of operation thereof is depicted in the present disclosure and throughout FIGS. 1-5. Circuit 10 is a new and improved apparatus linearized time amplifier with increased resolution, as will be discussed hereafter.

The new circuit 10 has performed well within simulations (including Monte Carlo) which show greater performance than currently published prior art. Additionally, arbitrarily small time differences are acceptable and linearity is within acceptable bounds for a pipelined TDC. The gain may be arbitrarily programmable with variable current bias and is largely PVT (Process, Voltage and Temperature) invariant which allows for virtually ubiquitous usage.

Figure 1:
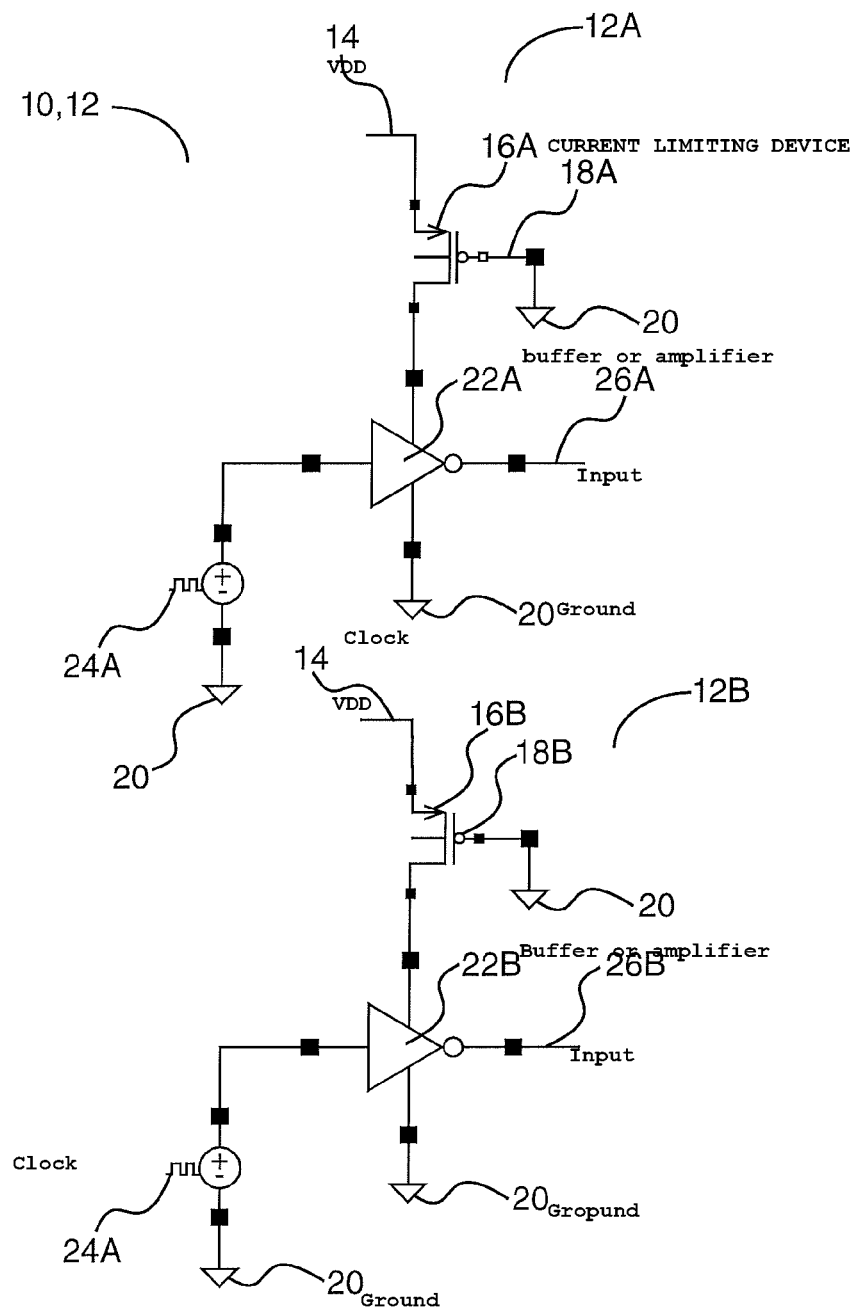
FIG. 1 (FIG. 1) shows a portion of the asymmetric manipulator within the circuit.
Figure 2:
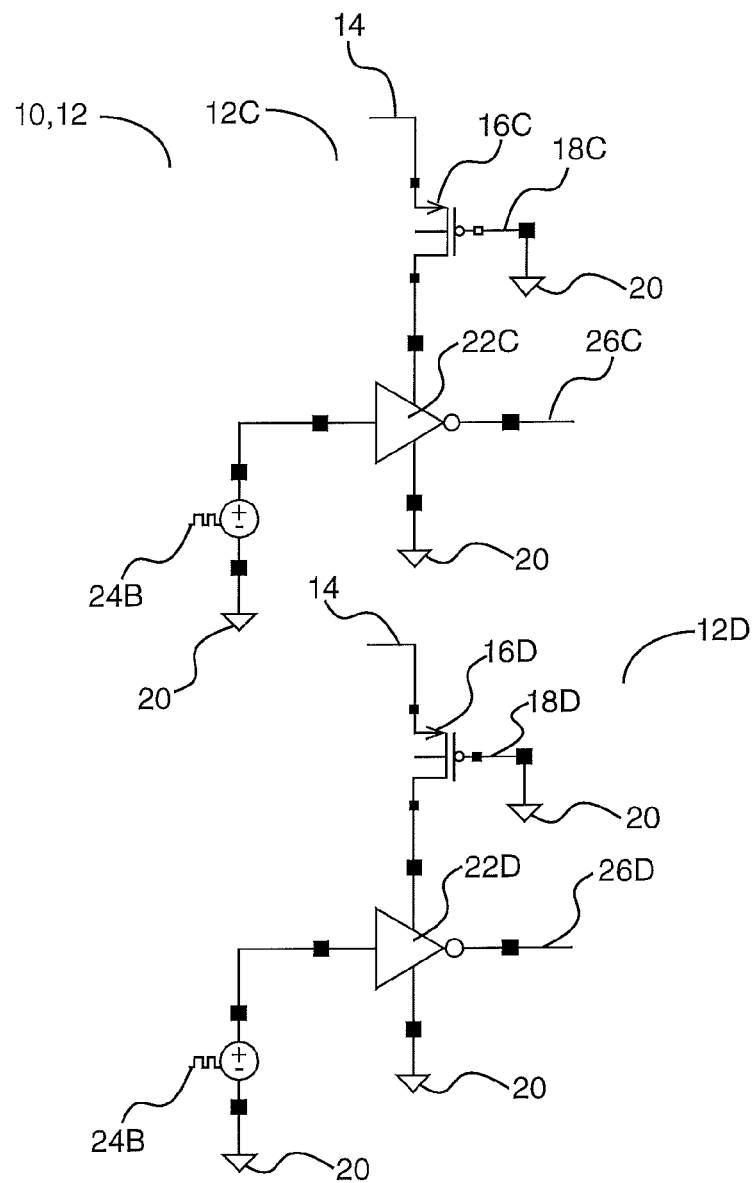
FIG. 2 (FIG. 2) further shows a further portion of the asymmetric manipulator within the circuit.
Figure 3:
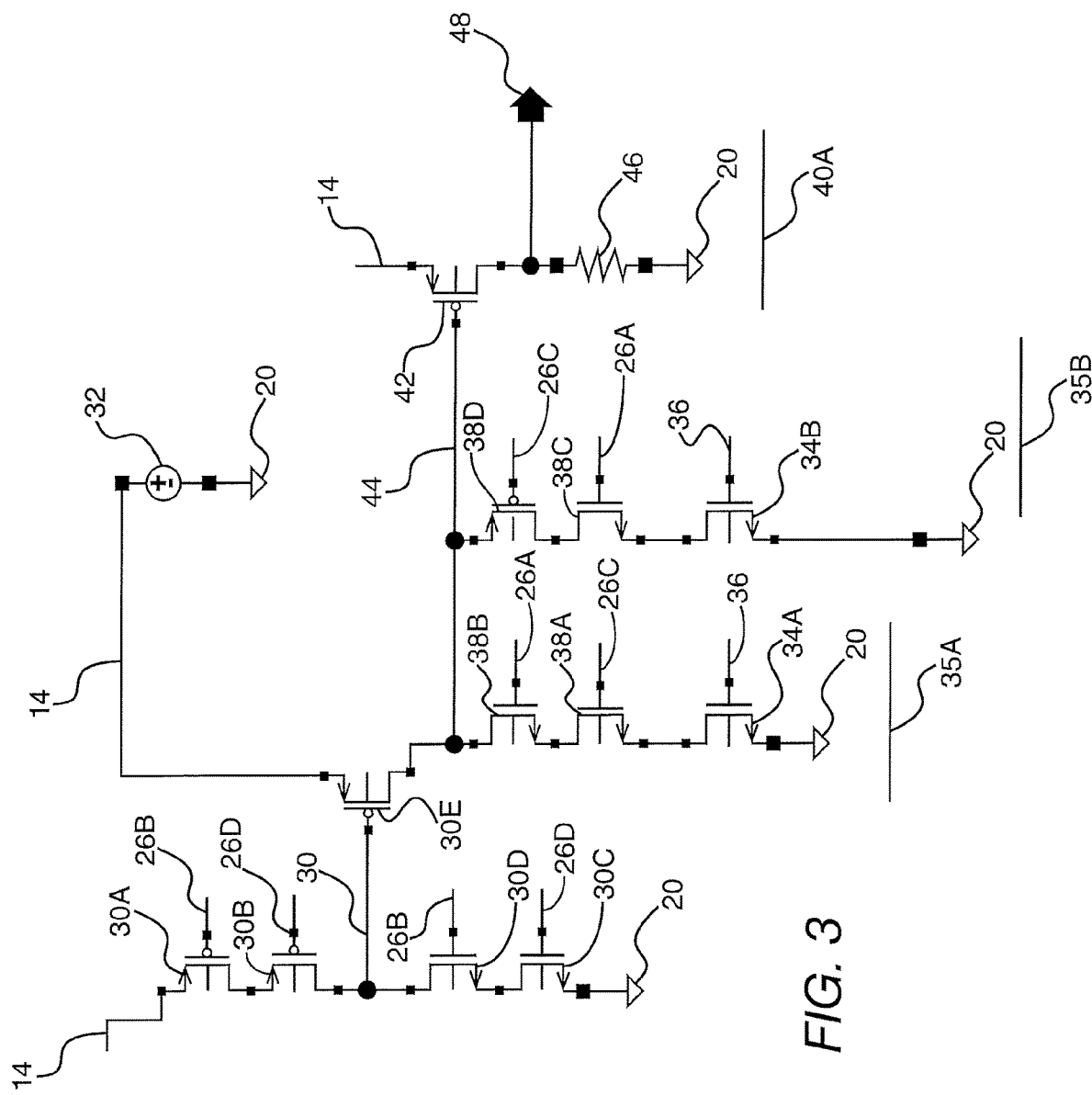
FIG. 3 (FIG. 3) further shows an upper portion of the circuit generating a first output signal.
Figure 4:
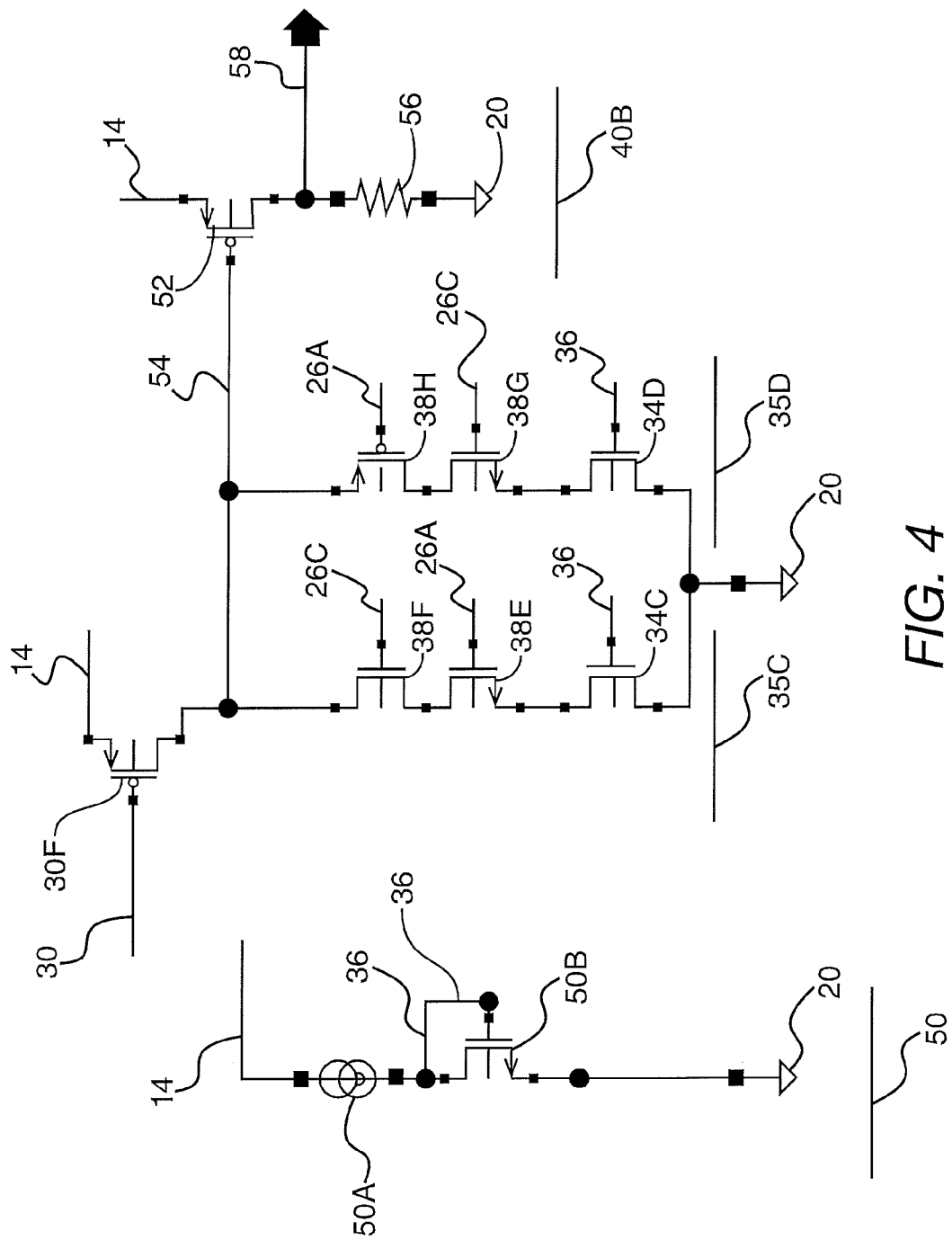
FIG. 4 (FIG. 4) further shows a lower portion of the circuit generating a second output signal.

FIG. 1 depicts a portion of the circuit 10 diagrammatically and FIG. 2, FIG. 3, and FIG. 4 are shown as being connected to FIG. 1 through the use of similar reference numerals throughout. The schematics of FIG. 1, FIG. 2, FIG. 3, and FIG. 4 are to be understood and should be read together. Accordingly, reference to the circuit 10 may be made with reference to FIG. 1, FIG. 2, FIG. 3, and FIG. 4. When viewing this disclosure, a reader will understand to review FIG. 1, FIG. 2, FIG. 3, and FIG. 4 at the same time as many of the components and electrical connections span both figures and require viewing both figures to understand how voltages and current flow through each portion of the circuit 10.

Further, the circuit includes at least one input and at least one output. Electrical signals flow from the input to the output to establish a flow of electrons that are amplified and otherwise manipulated therebetween. Accordingly, some components of the circuit may be made with reference as being positioned upstream or downstream from other components relative to the flow of electrons from the at least one input to the at least one output.

Any reference to nfet or pfet refers to the general class of 3 or more terminal semiconductor devices characterized by the behavior of having one or more modes of conduction caused by having a voltage between a control and other terminal that exceeds or is lower than a certain threshold, whose behavior outside of these regions is characterized by lack of conduction. Such devices could include, but is not limited to, N-type mesfets, P-type mesfets, mosfets, RF devices, extended drain mosfets, bipolar junctions, or high electron mobility devices (HEMTs). RF transistors can be extremely sensitive to static discharge and may be faster when operated in their linear modes without saturation. As such, it may be a practical design choice for an end user in a specific situation.

Referring generally to FIG. 1 and FIG. 2, a portion of the circuit 10, namely an asymmetric manipulator 12 is shown. The asymmetric manipulator 12 consists of four parts spread across FIG. 1 and FIGS. 2, 12A, 12B, 12C, and 12D. The asymmetric manipulator 12 includes a supply source (or VDD) 14 that is fed into a first top portion 12A and a first bottom portion 12B within FIG. 1, and fed to a second top portion 12C and a second bottom portion 12D in FIG. 2

Referring specifically to FIG. 1, the first top portion 12A of the asymmetric manipulator 12, the supply source 14 then comes is electrically coupled with a first transistor or current limiting device 16A within the first top portion 12A and thus is the source for the transistor 16A. As used hereinafter when a transistor is mentioned it is also possible that it is merely a current limiting device that may be a resistor, transistor, routing device or induction device but is drawn as a transistor for the sake of clarity and brevity. The first transistor 16A is a short when its value is 0 and open when its value is 1. In one embodiment it is a pfet type transistor. A first gate 18A is electrically coupled with the first transistor 16A as well as ground 20. Further downstream from the first gate 18A is a first inverter or buffer 22A.

The first inverter or buffer 22A is connected a first clock 24A on a left side, the ground 20 on the bottom side and a first input 26A on the right side. It will be understood that the ultimate sides do not matter, as all connections could come off in the same direction or in different directions based on circuit layout and structure. As such, merely the shown embodiment is discussed and described for the sake of clarity and brevity. The first input 26A is so named as it feeds other portions of the circuit 10 which will become apparent within the description of future portions of the circuit 10 in FIG. 3 and FIG. 4.

Referring now to the first bottom portion 12B, the supply source 14 then comes is electrically coupled with a second transistor 16B within the first bottom portion 12B and thus is the source for the transistor. The second transistor 16B is a short when its value is 0 and open when its value is 1. In one embodiment it is a pfet type transistor. A second gate 18B is electrically coupled with the second transistor 16B as well as ground 20. Further downstream from the second gate 18B is a second inverter or buffer 22B.

The second inverter or buffer 22B is connected to a first clock 24A on a left side, the ground 20 on the bottom side and a first inverted input 26B on the right side. The first inverted input 26B is so named as it feeds other portions of the circuit 10 which will become apparent within the description of future portions of the circuit 10 in FIG. 3.

Referring specifically to FIG. 2, the second top portion 12C, the supply source 14 then comes is electrically coupled with a third transistor 16C within the second top portion 12C and thus is the source for the transistor. The third transistor 16C is a short when its value is 0 and open when its value is 1. In one embodiment it is a pfet type transistor. A third gate 18C is electrically coupled with the third transistor 16C as well as ground 20. Further downstream from the third gate 18C is a third inverter or buffer 22C.

The third inverter or buffer 22C is connected to a second clock 24B on a left side, the ground 20 on the bottom side and a second input 26C on the right side. The second input 26C is so named as it feeds other portions of the circuit 10 which will become apparent within the description of future portions of the circuit 10 in FIG. 3 and FIG. 4.

As discussed above, an exemplary embodiment provides for the first clock 24A to be a known clock and now the second clock 24B to be a measured or system clock. However, in further exemplary embodiments the clock desired to be measured and the known clock may be switched, or both may be measured clocks.

Referring now to the second bottom portion 12D, the supply source 14 then comes is electrically coupled with a fourth transistor 16D within the second bottom portion 12D and thus is the source for the transistor. The fourth transistor 16D is a short when its value is 0 and open when its value is 1. In one embodiment it is a pfet type transistor. A fourth gate 18D is electrically coupled with the fourth transistor 16D as well as ground 20. Further downstream from the fourth gate 18D is a fourth inverter or buffer 22D.

The fourth inverter or buffer 22D is connected to the second clock 24B on a left side, the ground 20 on the bottom and a second inverted input 26D on the right. The second inverted input 26D is so named as it feeds other portions of the circuit 10 which will become apparent within the description of future portions of the circuit in FIG. 3.

Referring now to FIG. 3, a further portion of the circuit 10 is shown. Specifically, an upper portion including the reset 28 and further portion of the circuit with a first output.

Referring first to the reset circuit 28 shown on the left side with a four transistor stack. VDD 14 is applied to the top of the transistor stack leading to a first reset transistor 30A. The first reset transistor 30A is a short when its value is 0 and open when its value is 1. In one embodiment it is a pfet type transistor. The gate side of the transistor is fed by the first inverted input 26B.

Continuing on, the drain side of the first reset transistor 30A becomes the source for a second reset transistor 30B. The second reset transistor 30B is a short when its value is 0 and open when its value is 1. In one embodiment it is a pfet type transistor. The gate side of the second reset transistor 30B is fed by the second inverted input 26D.

Continuing now at the bottom of the reset circuit 28, a third reset transistor 30C is shown. The third reset transistor 30C transistor is a short when its value is 1 and open when its value is 0. In one embodiment it is an nfet type transistor. The third reset transistor 30C is connected to ground 20. The third reset transistor 30C has a gate side fed by the second inverted input 26D.

Moving upward, the drain side of the third reset transistor 30C becomes the source for a fourth reset transistor 30D. The fourth reset transistor 30D transistor is a short when its value is 1 and open when its value is 0. In one embodiment it is an nfet type transistor. The gate side of the fourth reset transistor 30D is fed by the first inverted input 26B.

The bottom of the second reset transistor 30B and the fourth reset transistor 30D are fed to a further transistor 30E on the right. The further transistor 30E transistor is a short when its value is 0 and open when its value is 1. In one embodiment it is a pfet type transistor. The further transistor 30E is fed by an actual source 32, that feeds VDD or the source 14 to the rest of the circuit at its top. The actual source 32 is connected to ground 20 and VDD 14.

With continued reference to FIG. 3, there are two sets of three transistors, a first set 35A and a second set 35B, on the lower right and adjacent to the further transistor 30E. The first set of transistors starting from the bottom left is a first vbias transistor 34A. The first bias transistor 34A in the exemplary embodiment is of an nfet type. The first bias transistor 34A is connected to ground 20 at its bottom. The first bias transistor 34A has a gate side fed by vbias 36, which will be explained with respect to FIG. 4 later.

The first bias transistor 34A at the bottom of the first set 35A is fed to a further first transistor 38A. Thus, the source of the further first transistor 38A is fed from the output of the first bias transistor 34A and the first further transistor is connected to ground at its bottom. As the further first transistor 38A transistor is a short when its value is 1 and open when its value is 0. In one embodiment it is an nfet type transistor. The gate side of the first further transistor 38A is fed by the second input 26C on the right.

Above the further first transistor 38A is a further second transistor 38B. The further second transistor 38B is a short when its value is 1 and open when its value is 0. In one embodiment it is an nfet type transistor. The gate side of the further second transistor 38B is fed by the first input 26A.

Referring now to the second set of three transistors 35B adjacent to the further transistor 30E, the second set of transistors starting from the bottom right is a second vbias transistor 34B. The second vbias transistor 34B is attached to ground 20. In one embodiment it is an nfet type transistor. The gate side of the second vbias transistor 34B is connected to vbias 36.

Above the second bias transistor 34B is connected to a further third transistor 38C. The source for the further third transistor 38C is fed from the output of the second vbias transistor 34B. As the third transistor 38C transistor is a short when its value is 1 and open when its value is 0. In one embodiment it is an nfet type transistor. The gate side of the third transistor 38C is fed by the first input 26A.

The drain of the further third transistor 38C, above is a further fourth transistor 38D. The further fourth transistor 38D is a short when its value is 0 and open when its value is 1. In one embodiment it is a pfet type transistor. The gate side of the fourth transistor 38D s fed by the second input 26C.

Continuing on, to the first set of transistors 35A (34A, 38A, 38B) and second set of transistors 35B, (34B, 38C, 38D) on the right and left adjacent to the first further transistor 30E is a first pseudo-pmos inverter 40A. The first pseudo-pmos inverter 40A has a first pseudo-pmos transistor 42 is a short when its value is 0 and open when its value is 1. In one embodiment it is a pfet type transistor. The first pseudo-pmos transistor 40A is the gate side of the output of first ramp 44 is fed by VDD 14. The drain side is to a first resistor 46 which is electrically connected to ground 20 and a first signal pulse 48.

Referring now to FIG. 4, a further lower portion of an exemplary circuit is shown. Part of the further portion is a current mirror 50. The current mirror is represented by the partially overlapping circles 50A and is operative to run through the current mirroring transistor 50B, with vbias 36 as both the drain and the gate. The current mirroring transistor 50B transistor is a short when its value is 1 and open when its value is 0. In one embodiment it is an nfet type transistor. The supply side will then be connected to ground 20.

Referring now to the top of the circuit shown on this page there is a second further transistor 30F on the right. The second further transistor 30F is fed by VDD 14. The second further transistor 30F is a short when its value is 0 and open when its value is 1. In one embodiment it is a pfet type transistor. The second further transistor 30F has a gate to the reset 30, and its drain is further downstream to the further lower portion of the circuit.

Referring now are two sets of three transistors, a third set 35C and fourth set 35D on a right side of the current mirror 50, and adjacent to the second further transistor 30F. The first set of transistors starting from the bottom left is a third vbias transistor 34C. The first bias transistor in one embodiment it is an nfet type transistor. The third bias transistor 34C is connected to ground 20. The third bias transistor 34C has a gate side fed by vbias 36.

The drain of the third bias transistor 34C is fed above to a fifth transistor 38E. The source of the fifth transistor 38E is fed from the output of the third vbias transistor 34C. The fifth transistor 38E is a short when its value is 1 and open when its value is 0. In one embodiment it is an nfet type transistor. The gate side of the fifth transistor 34E is fed by the first input 26A.

On drain of the fifth transistor 38E, above it is a sixth transistor 38F. The source for the sixth transistor 38F is fed from the output of the fifth transistor 38E. The sixth transistor 38F is a short when its value is 1 and open when its value is 0. In one embodiment it is an nfet type transistor. The gate side of the sixth transistor 38F is fed by the second input 26C.

Referring now to the second set of three transistors adjacent to the second further transistor 30F, the second set of transistors starting from the bottom right is a fourth vbias transistor 34D. The fourth vbias transistor 34D is attached to ground 20. The fourth vbias transistor 34D in one embodiment is an nfet type transistor. The gate side of the fourth vbias transistor 34D is connected to vbias 36.

The drain of the fourth bias transistor 34D is connected above to a seventh transistor 38G. The source for the seventh transistor 38G is fed from the output of the fourth vbias transistor 34D. As the seventh transistor 38G is a short when its value is 1 and open when its value is 0. In one embodiment it is an nfet type transistor. The gate side of the seventh transistor 34G is fed by the second input 26C.

The drain of the seventh transistor 38G is an eighth transistor 38H. The eighth transistor 38H is a short when its value is 0 and open when its value is 1. In one embodiment it is a pfet type transistor. The gate side of the eighth transistor 38G is fed by the first input 26A.

Continuing on, to the right of the two sets of three transistors, the third set 35C (34C, 38E, 38F) and the fourth set 35D (34D, 38G, 38H) on the right and left adjacent to the second further transistor 30F is a second pseudo-pmos inverter 40B. The pseudo-pmos inverter has a second pseudo-pmos transistor 52 that is a short when its value is 0 and open when its value is 1. In one embodiment it is a pfet type transistor. The second pseudo-pmos transistor 52 is the gate side of the output of second ramp 54 and is fed by VDD 14. The drain side is to a second resistor 56 which is electrically coupled to ground 20 and a second signal pulse 58.

FIG. 3 is referred to as a further upper portion and FIG. 4 is referred to as a further lower portion. These are merely arbitrary labels as to better understand the disclosure. One skilled in the art will realize that they are interchangeable and are merely for the sake of clarity.

Having now described the structure of the device and the various components and connections thereof within the device, a method of use therefor will now be described.

The first gate 18A permits electrons to flow through, or is operative to block their passage by creating or eliminating a channel between the source 14 and the drain. When the source is passing through the first gate 18A, ground 20 controls whether or not current is allowed to pass from drain to source. As used hereinafter, all transistor devices will be assumed to function in the same general manner with their gates even if not explicitly disclosed.

When the source 14 is not passing through the first gate 18A it is routed to a first inverter or buffer 22A on the top side of the first inverter or buffer 22A. As the current passes through the first inverter or buffer 22A, it is electrically coupled with the first clock 24A. The first clock 24A is operative to give either a known clock or the clock that is desired to be measured voltage output as a square wave.

For the sake of clarity in an exemplary embodiment described herein, the first clock 24A will be a known clock. However, in further exemplary embodiments it may be the clock desired to be measured, in such an embodiment, the known clock would switch with a system clock. Either the first clock 24A or the known clock are operative to be an output of an oscillator providing square waveforms to the circuit. After the voltage is fed into the first inverter or buffer 22A from the first clock 24A along from the current from the source 14, through the first transistor 16A, it is then outputted into a first input 26A. The first clock 24A, is said to be subjected to the asymmetric manipulator 12 as the signal routes through to the rest of the circuit 10 to generate the first input 26A.

The second gate 18B permits electrons to flow through, or is operative to block their passage by creating or eliminating a channel between the source 14 and drain. On the other hand, when the source 14 is not passing through the second gate 18B it is routed to the second inverter or buffer 22B on the top side of the second inverter or buffer 22B. As the current passes through the second inverter or buffer 22B, it is electrically coupled with the first clock 24A. The first clock 24A is operative to give either a known clock or the clock that is desired to be measured voltage output as a square wave. For the sake of clarity, similar to that of the first top portion 12A, in the exemplary embodiment, the first clock 24A will be a known clock. The first clock 24A, is said to be subjected to the asymmetric manipulator 12 as the signal routes through to the rest of the circuit 10 to generate the first inverted input 26B.

After the voltage is fed into the second inverter or buffer 22B from the first clock 24A along from the current from the source 14, through the second transistor 16B it is then outputted into the first inverted input 26B. The first inverted input 26B is directly 180 degrees out of phase with the first input 26A.

The third gate 18C permits electrons to flow through, or is operative to block their passage by creating or eliminating a channel between the source 14 and drain. When the source 14 is not passing through the third gate 18C it is routed to the third inverter or buffer 22C on the top side of the third inverter or buffer 22C. As the current passes through the third inverter or buffer 22C, it comes is electrically coupled with the second clock 24B. The second clock 24B is connected to ground 20 on one side and the third inverter or buffer 22C on the other side. The second clock 24B is operative to give either a known clock or the clock that is desired to be measured voltage output as a square wave. The second clock 24B, is said to be subjected to the asymmetric manipulator 12 as the signal routes through to the rest of the circuit 10.

After the voltage is fed into the third inverter or buffer 22C from the second clock 24B along from the current from the source 14, through the third transistor 16C, it is then outputted into a second input 26C. The second input 26C feeds other portions of the circuit 10. The second clock 24B, is said to be subjected to the asymmetric manipulator 12 as the signal routes through to the rest of the circuit 10 to generate the second input 26C.

The fourth gate 18D permits electrons to flow through, or is operative to block their passage by creating or eliminating the channel between the source 14 and drain. On the other hand, when the source 14 is not passing through the fourth gate 18D it is routed to the fourth inverter or buffer 22D on the top side of the fourth inverter or buffer 22D. As the current passes through the fourth inverter or buffer 22D, it is electrically coupled with the second clock 24B. The second clock 24B is connected to ground 20 on one side and the fourth inverter or buffer 22D on the other side. The second clock 24B is operative to give either a known clock or the clock that is desired to be measured voltage output as a square wave. For the sake of clarity, similar to that of the second top portion 12C, in the exemplary embodiment, the second clock 24B will be a measured clock.

After the voltage is fed into the fourth inverter or buffer 22D from the second clock 24B along from the current from the source 14, through the fourth transistor 16D, it is then outputted into a second inverted input 26D. The second inverted input 26D feeds other portions of the circuit 10 and is directly 180 degrees out of phase with the second input 26C. The second clock 24B, is said to be subjected to the asymmetric manipulator 12 as the signal routes through to the rest of the circuit 10 to generate the second inverted input 26D.

The four transistors 30A, 30B, 30C, 30D are operative to generate the reset pulse 30. Generally, a NAND gate is used within prior art systems. However, a NAND gate does not have a high impedance state. However, in this architecture, this type of circuit is far more advantageous as the high impedance allows the charge injection to work. Therefore, when reset is low, the outputs are high, or approximately VDD 14. The reset circuit 28 is conducting when both the inputs 26B, 26D are 0, the further transistor 30E will go into conduction. When both of them 26B, 26D are 1, then it will go to low. When they are different, the reset circuit will disconnect.

In the exemplary embodiment, a time amplifier accepts two clock signals as inputs, the first input 26A and the second input 26C. Further, two clock signals are generated as outputs, the first signal pulse 48 and the second signal pulse 58. Both of these pulses 48, 58 are directly proportional to the time that a signal takes to travel to its respective path through the circuit.

The first input 26A and second input 26C into the circuit 10 are two square-waves. Square-waves are merely an exemplary embodiment and the circuit 10 may further accept sinewaves, trapezoidal waves or any other periodic waveform. The edges of the first input 26A and second input 26C are separated by some time difference "t".

For the purposes of illustration, assume that the edge of the second input 26C occurs before the edge of the first input 26A. Now when the current of first input 26A is high and second input 26C is low, the edge of the second input 26C occurs before the first input 26A, the only branch to draw current is the fourth set 35D. This is due to the fact that the value on the seventh transistor 38G is a short as the first input 26A value is high on a nfet type transistor, and the value of the eighth transistor 38H is that of a short as the second input 26C is low on a pfet type transistor. As a result, the value of the second pseudo-pmos transistor 52 is being drained towards a short value within the ramp 54.

Then, when the first input 26A and second input 26C are both high as both of the edges have occurred, this will cause both the third set 35C and the first set 35A to conduct current, which will lower both the first pseudo-pmos transistor 42 and the second pseudo-pmos transistor 52 by the same amount. This is due to the fact that when both the first input 26A and second input 26C are high, this causes a short in the transistors 38A, 38B, 38E, 38F. Then, since the first set 35A, third set 35C, and fourth set 35D have conducted, but not the second set 35B, the second pseudo pmos transistor 52 for generating the second signal pulse 58 will go towards zero faster than the first pseudo-pmos transistor 48 along with the ramp 44 to generate the first signal pulse 48 will. This will cause the second pseudo-pmos transistor 52 to switch before the first pseudo-pmos transistor 42.

The same process could be done where the edge of the first input 26A occurs before the edge of the second input 26C. If that would occur, then the first set 35A, second set 35B, and fourth set 35D would be conducting. This would lead to the first pseudo-pmos transistor 42 to switch before the second pseudo-pmos transistor 52.

While using a first and second pseudo-pmos transistor 42, 52 they both may be considered 'triggering' devices. Or, devices that when enabled, engage and are operative to pass signal on to the next device within the circuit (not shown).

In further embodiments, a comparator could be used instead of a pseudo-pmos inverters 40A, 40B. However, as a practical consideration, a comparator is not as fast as a pseudo-pmos inverter. Therefore, the decision is a practical concern for circuit design, but in this case the circuit desired to be as fast as possible, as such, the pseudo-pmos inverter is ideal for this sub-picosecond environment.

Similar to the input, the circuit outputs two similar square waves, the first signal pulse 48 and the second signal pulse 58, whose edges are separated by time difference where "G" is the gain of this circuit 10. The output time difference ($\Delta$TOUT) between the rising edges of the first signal pulse 48 and second signal pulse 58 is linearly proportional to the input time difference ($\Delta$TIN) between the rising edges of the first input 26A and second input 26C, such that $\Delta$TOUT=G·$\Delta$TIN+TOS, where G is the time gain and TOS is a time offset.

In a further exemplary embodiment, there may be a second current mirror (not shown). The second current mirror is operative to feed a second vbias amount to further transistors connected to either pair of first and second vbias transistors 34A, 34B or the pair of third and fourth vbias transistors 34C, 34D.

As discussed above, if a set of further vbias transistor was added there would be two different vbias voltages, allowing for an additional gain manipulation leading to each ramp 44, 54 output by providing additional vbias voltages within an exemplary circuit.

Figure 5:
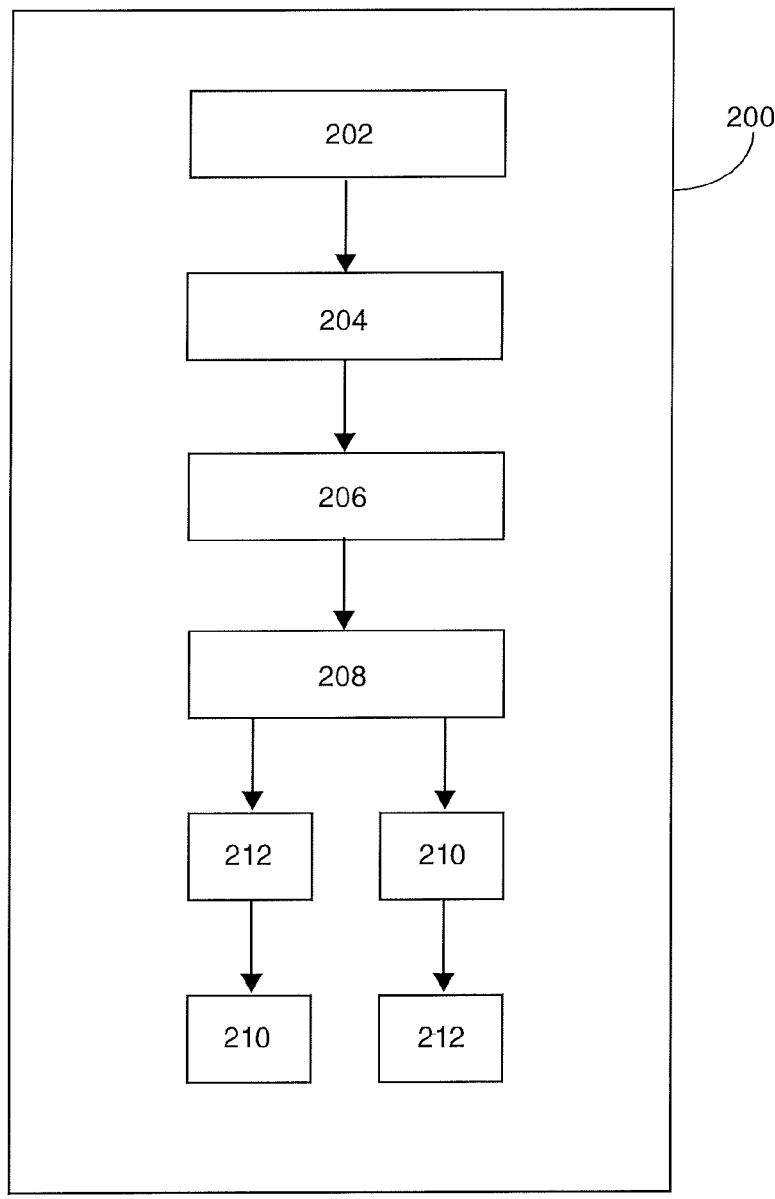
FIG. 5 (FIG. 5) shows an exemplary method flow chart.

Referring now to FIG. 5, an exemplary method flow chart 200 is disclosed and described. The exemplary method provides for a method for measuring digital signals including: inserting a first signal from a first clock into a first branch of an asymmetric manipulator 202; outputting a first input signal from the asymmetric manipulator 204; inserting a second signal from a second clock into a second branch of an asymmetric manipulator 206; outputting a second input signal from the asymmetric manipulator 208; transmitting the first signal and second signal to four sets of transistors 210; and interchangeably: triggering a first output signal when the first and second set of transistors are engaged, said output relating to the second signal travel time through the circuit 212; or triggering a second output signal and the third and fourth set of transistors engaged relating to the first signal travel time through the circuit 214 where both occur, just in potential different order.

The asymmetric manipulator 12 is so named as the goal is to have a delayed rising edge and a fast falling edge on the output wave, thus providing the asymmetry between the two edges. The rising edge is slowed by routing the VDD 14 through a transistor (16A, 16B, 16C, 16D) as well as an inverter or buffer (22A, 22B, 22C, 22D). The falling edge is able to remain fast by avoiding the transistor and merely going to ground 20.

The current described device 10 is able to have constant gain due to charge injection. Linearity and gain are both dependent on a charge injection from the falling edge of the input signals 26A, 26B, 26C, 26D, therefore the falling edge must stay fast. That is, if the gain is 4, and a value of 1 is the output, the value you get is 4, put in a 2, get an 8, etc. However, due to parasitic effects within a prior art type system, if you put in a 1, you can get a 4, but if you put in a 2, you may only get a 7. As a result, without constant gain, there may be drift of the ultimate output signals 48, 58.

As any edge comes about, it is capacitively coupled to another node. But, as it turns out, the only edge that contributes to the linearity of the circuit is the falling edge. As such, it is the desirable edge to make fast which leaves the rising edge to be slow, as it is integrated over the entire duration of the rise edge. The signal of the falling edge, because it is fast, has a propensity to transfer from one to the other quickly, as the nodes are coupling directly. Since capacitance is most effective at high frequencies, by coupling directly from input to output, or a feed forward path, allows some level of linearity, as the rising edge contributes minimally to the parasitic capacitance.

Thus, it is a requirement to have non-symmetric rise and fall to gain benefits of longer current integration without losing charge injection caused by stray capacitance and parasitic effects within the circuit 10. If one has a fast edge on both the rise and fall edges, the result is a non-linear, nonmonotonic, low gain transfer function. Similarly, it is problematic if both edges are slowed, the result is gain compression at higher input time differences. Therefore, the best solution is to allow for linear gain to occur at small resolution (sub picosecond).

In the exemplary embodiment, and as is shown in the drawings, there is included one current source 14 or 32. However, it is possible to use more current sources. By adding additional current devices, there may be different levels of gain through the use of vbias 36, or other opportunities to provide a "knob" or otherwise adjustable mechanism used to adjust to enable calibration or adjustment of the circuit's offset.

The next circuit in line after receiving the first signal pulse 48 and the second signal pulse 58 is operative to determine the time difference between the two by solving for t, by dividing by the gain, and knowing the value of the known clock, or in our disclosure the first clock 22A. As a result of increasing the gain, the future circuit may see a larger pulse that otherwise would have been swallowed if it were not subjected to the gain. As such, increased resolution may be realized at the sub-picosecond level.

Prior art solutions have provided for capacitors to be within a circuits for similar purposes as is disclosed herein. However, the capacitance within the exemplary circuit 10 is parasitic and as a result is merely part of the physical device geometry. A capacitor could be used, but due to the fact that it takes time to discharge and recharge, it would slow down the circuit 10. Capacitors may be used if the intended purpose for the circuit would still work properly, but the instant disclosure is related to maximizing speed, as such an explicit capacitor is not needed.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0. % of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A signal routing device comprising:
   a first clock signal generator that generates a first clock signal comprising a first clock signal rising edge and a first clock signal falling edge;
   a second clock signal generator that generates a second clock signal comprising a second clock signal rising edge and a second clock signal falling edge;
   an asymmetric manipulator comprising:
      a current limiting device;
      an inverter; and
      a ground, wherein the first clock signal and the second clock signal are subjected to the asymmetric manipulator and generate a first input and a second input respectively, wherein the first clock signal rising edge and the second clock signal rising edge are routed through the current limiting device and inverter upon initial input into a circuit and generate a first input delayed rising edge and a second input delayed rising edge respectively, and wherein the first clock signal falling edge and the second clock signal falling edge are routed to the ground, without passing through the current limiting device, upon initial input into the circuit and generate a first input fast falling edge and a second input fast falling edge respectively; and
   at least one triggering device operative to output at least one signal pulse based on travel time of the first input and second input through the circuit.

2. The device of claim 1, wherein the triggering device is a pseudo-pmos inverter.

3. The device of claim 1, wherein the device is free of any capacitor.

4. The device of claim 1, further comprising:
   a receiving device operative to receive the at least one signal pulse and interpret the at least one signal pulse.

5. The receiving device of claim 4, wherein the receiving device is operative to determine the time difference between the at least one signal pulse and divide by a known gain of the circuit to determine sub-picosecond time differences.

6. The device of claim 1, wherein the triggering device is a comparator.

7. The device of claim 1, further comprising: a tristate inverter for generating a reset pulse and a reset circuit in the tristate inverter including:
   a first inverted input and a second inverted input, wherein the first inverted input and second inverted input occur as a result of subjecting a first clock signal and a second clock signal to the asymmetrical manipulator and the first inverted input and second inverted input are both 180 degrees out of phase when compared to the first input and second input, respectively; and
   at least four transistors, that feed a further transistor, wherein when both first and second inverted inputs are 0, the further transistor will go into conduction, and when both of the first and second inverted inputs are 1, the further transistor will go to low, and when the first and second inverted inputs are different, the further transistor will cause the reset circuit to disconnect.

8. The device of claim 1, further comprising a power source generating a first voltage applied to the asymmetric manipulator and a second voltage applied to a portion of the circuit, wherein the second voltage is adjustable to provide adjustable gain within the circuit as a whole.

9. The device of claim 8, further comprising a third voltage differing from the first voltage and second voltage and is applied to a portion of the circuit, differing from the portion of the second voltage, wherein both the second voltage and the third voltage are adjustable independently to provide gain to the portion of the circuit to which they are applied.

10. A method for measuring digital signals including:
    receiving a first signal from a first clock into a first branch of an asymmetric manipulator;
    outputting a first input signal from the asymmetric manipulator;
    receiving a second signal from a second clock into a second branch of an asymmetric manipulator;
    outputting a second input signal from the asymmetric manipulator;
    transmitting the first signal and second signal to four sets of transistors; and interchangeably:
       triggering a first output signal when the first and second set of transistors are engaged, said output relating to the second signal travel time through the circuit; or
       triggering a second output signal and the third and fourth set of transistors engaged relating to the first signal travel time through the circuit.

11. The method of claim 10, further comprising:
    routing the first signal from the first clock into a current limiting device prior to outputting the first input signal; and
    routing the second signal from the second clock into a current limiting device prior outputting the second input signal.

12. The method of claim 10, wherein after transmitting the signals includes:
    passing the first input signal through a second transistor in the first set;
    passing the second input signal through a first transistor in the first set;
    passing the first input signal through a first transistor in the second set;
    passing the second input signal through a second transistor in the second set;
    passing the first input signal through a first transistor in the third set;
    passing the second input signal through a second transistor in the third set;
    passing the first input signal through a second transistor in the fourth set; and
    passing the second input signal through a first transistor in the fourth set.

13. The method of claim 10, further comprising:
    analyzing the first output signal and second output signal to determine if the first and second clock are properly in time by measuring a time offset.

14. The method of claim 10, wherein prior to inserting the first signal and inserting the second signal includes:
    introducing a source voltage to the asymmetric manipulator.

15. The method of claim 14, further comprising:
    feeding a biased voltage to the four sets of transistors.

16. The method of claim 15, further comprising:
    adjusting gain of the circuit based on the biased voltage fed to the four sets of transistors.

17. The method of claim 16, further comprising:
    accounting for the gain and analyzing the first output signal and second output signal to determine if the first and second clock are properly in time by measuring a time offset.

18. The method of claim 17, further comprising:
    generating a reset pulse with a tristate inverter, wherein the tristate inverter comprises: a reset circuit including:

a first inverted input and a second inverted input, wherein the first inverted input and second inverted input occur as a result of subjecting a first inverted clock signal and a second inverted clock signal to the asymmetrical manipulator and the first inverted input and second inverted input are both 180 degrees out of phase when compared to the first input and second input respectively; and a series of four transistors, that feed a further transistor, wherein when both first and second inverted inputs are 0, the further transistor will go into conduction, and when both of the first and second inverted inputs are 1, the further transistor will go to low, and when the first and second inverted inputs are different, the further transistor will cause the reset circuit to disconnect.

19. A circuit comprising:

a first clock signal generator that generates a first clock signal;

a second clock signal generator that generates a second clock signal;

an asymmetric manipulator, wherein the first clock signal and second clock signal are subjected to the asymmetric manipulator upon initial input into a circuit and generate a first input and a second input, and a first inverted input and a second inverted input that are 180 degrees out of phase with the first input and the second input, respectively;

four transistor sets;

wherein the first input passes through a second transistor in the first set, and the second input through a first transistor in the first set;

the first input passes through a first transistor in the second set and the second signal passes through a second transistor in the second set;

the first input passes through a first transistor in the third set and the second input passes through a second transistor in the third set;

the first input passes through a second transistor in the fourth set and the second input passes through a first transistor in the fourth set; and wherein each set of transistors is coupled with a programmable vbias transistor operative to set a gain value for each set of transistors; and a first pseudo-pmos transistor in electrical engagement with the first set and second set of transistors and a second pseudo-pmos transistor in electrical engagement with the third set and fourth set of transistors, wherein when the first set and second set of transistors are drained, the first pseudo-pmos transistor will output a first signal pulse to a detector and when the third and fourth set of transistors are drained, the second pseudo-pmos transistor will output a second signal pulse to the detector.

* * * * *